(12) United States Patent
Wang et al.

(10) Patent No.: US 11,133,367 B2
(45) Date of Patent: Sep. 28, 2021

(54) THIN FILM TRANSISTOR AND FABRICATING METHOD THEREOF, ARRAY SUBSTRATE AND DISPLAY DEVICE

(71) Applicant: BOE TECHNOLOGY GROUP CO., LTD., Beijing (CN)

(72) Inventors: Ling Wang, Beijing (CN); Yicheng Lin, Beijing (CN); Cuili Gai, Beijing (CN); Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/619,446

(22) PCT Filed: May 21, 2019

(86) PCT No.: PCT/CN2019/087785
§ 371 (c)(1),
(2) Date: Dec. 4, 2019

(87) PCT Pub. No.: WO2019/223682
PCT Pub. Date: Nov. 28, 2019

(65) Prior Publication Data
US 2020/0161402 A1 May 21, 2020

(30) Foreign Application Priority Data
May 21, 2018 (CN) .......................... 201810487978.3

(51) Int. Cl.
*H01L 27/32* (2006.01)
*H01L 29/786* (2006.01)
(Continued)

(52) U.S. Cl.
CPC ...... *H01L 27/3272* (2013.01); *H01L 23/5226* (2013.01); *H01L 27/1225* (2013.01);
(Continued)

(58) Field of Classification Search
CPC ............ H01L 27/3272; H01L 27/1225; H01L 23/5226; H01L 29/41733; H01L 29/66969; H01L 29/78648
(Continued)

(56) References Cited

U.S. PATENT DOCUMENTS 8,310,413 B2 11/2012 Fish et al.
9,508,861 B2 11/2016 Yamazaki et al.
(Continued)

FOREIGN PATENT DOCUMENTS

| CN | 1934605 A | 3/2007 |
|---|---|---|
| CN | 103137641 A | 6/2013 |

(Continued)

OTHER PUBLICATIONS

Chinese Office Action dated Nov. 8, 2019, from application No. 201810487978.3.
(Continued)

*Primary Examiner* — Tong-Ho Kim
(74) *Attorney, Agent, or Firm* — Thomas | Horstemeyer, LLP

(57) ABSTRACT

A thin film transistor includes: a substrate base; a first gate electrode at a side of the substrate base; an active layer at a side of the first gate electrode away from the substrate base; a second gate electrode at a side of the active layer away from the substrate base; and a source/drain electrode at a side of the second gate electrode away from the substrate base. An orthographic projection of the source/drain electrode on the substrate base is at least partially overlapped with an orthographic projection of the second gate electrode on the substrate base.

13 Claims, 7 Drawing Sheets

(51) Int. Cl.
  *H01L 29/417* (2006.01)
  *H01L 23/522* (2006.01)
  *H01L 27/12* (2006.01)
  *H01L 29/66* (2006.01)

(52) U.S. Cl.
  CPC .. *H01L 29/41733* (2013.01); *H01L 29/66969* (2013.01); *H01L 29/78648* (2013.01)

(58) Field of Classification Search
  USPC .......................................................... 257/43
  See application file for complete search history.

(56) References Cited

U.S. PATENT DOCUMENTS

| | | | |
|---|---|---|---|
| 9,728,556 B2 | 8/2017 | Yamazaki et al. | |
| 10,043,828 B2 | 8/2018 | Yamazaki et al. | |
| 2007/0241998 A1 | 10/2007 | Fish et al. | |
| 2014/0145199 A1* | 5/2014 | Shi | H01L 29/66757 257/72 |
| 2014/0340608 A1* | 11/2014 | Yamazaki | H01L 29/78648 349/47 |
| 2016/0013242 A1* | 1/2016 | Yang | H01L 27/1446 257/292 |
| 2016/0035760 A1 | 2/2016 | Ning et al. | |
| 2017/0040348 A1 | 2/2017 | Yamazaki et al. | |
| 2017/0309650 A1 | 10/2017 | Yamazaki et al. | |
| 2019/0006393 A1 | 1/2019 | Yamazaki et al. | |

FOREIGN PATENT DOCUMENTS

| | | |
|---|---|---|
| CN | 203133439 U | 8/2013 |
| CN | 103280181 A | 9/2013 |
| CN | 104821339 A | 8/2015 |
| CN | 104977764 A | 10/2015 |
| CN | 103280181 B | 12/2015 |
| CN | 105720012 A | 6/2016 |
| CN | 104821339 B | 1/2018 |
| CN | 108767016 A | 11/2018 |
| EP | 1 728 234 A1 | 12/2006 |
| WO | WO-2005/091262 A1 | 9/2005 |
| WO | WO-2014/185480 A1 | 11/2014 |

OTHER PUBLICATIONS

International Search Report and Written Opinion dated Aug. 20, 2019, from application No. PCT/CN2019/087785.
Third Office Action for CN Patent Application No. 201810487978.3 dated Jan. 25, 2021.
First Office Action for India Patent Application No. 201927052125 dated May 21, 2021.

* cited by examiner

THIN FILM TRANSISTOR AND FABRICATING METHOD THEREOF, ARRAY SUBSTRATE AND DISPLAY DEVICE

CROSS-REFERENCE TO RELATED APPLICATIONS

This application is based on International Application No. PCT/CN2019/087785, filed on May 21, 2019, which is based on and claims priority to and benefit of Chinese patent application No. 201810487978.3, filed on May 21, 2018, the entire contents of which are incorporated herein by reference.

TECHNICAL FIELD

The arrangements of the present disclosure relate to the technical field of display, in particular to a thin film transistor and a fabricating method thereof, an array substrate and a display device.

BACKGROUND

Organic Light-Emitting diode (OLED) becomes one of hot spots in the current research field of panel displays. Compared with a Liquid Crystal Display (LCD), the OLED Display has the advantages of low energy consumption, low production cost, self-luminescence, wide viewing angle, fast response speed, and the like. Currently, in the display field referring to mobile phones, tablet computers, digital cameras and the like, OLED displays have begun to replace traditional LCD displays.

However, OLED displays suffer from brightness degradation during operation. In order to ensure uniform and continuous brightness of the OLED display, appropriate compensation methods are needed, one of which is optical compensation. The optical compensation is a method of detecting the pixel brightness by using the photosensitive element, and adjusting the data voltage in a targeted manner according to the obtained result so as to compensate the brightness. Currently, there is room for improvement in the design of compensation using photosensitive elements.

SUMMARY

According to an aspect of the present disclosure, a thin film transistor is provided. The thin film transistor includes: a substrate base; a first gate electrode at a side of the substrate base; an active layer at a side of the first gate electrode away from the substrate base; a second gate electrode at a side of the active layer away from the substrate base; and a source/drain electrode at a side of the second gate electrode away from the substrate base. An orthographic projection of the source/drain electrode on the substrate base is at least partially overlapped with an orthographic projection of the second gate electrode on the substrate base.

In some example arrangements of the present disclosure, the thin film transistor further includes: a buffer layer at a side of the first gate electrode away from the substrate base; a gate insulating layer at a side of the active layer away from the substrate base; and an interlayer dielectric layer at a side of the second gate electrode away from the substrate base.

In some example arrangements of the present disclosure, the thin film transistor further includes a connection electrode at a side of the interlayer dielectric layer away from the substrate base. The buffer layer includes a first via hole penetrating through the buffer layer, and an orthographic projection of the first via hole on the substrate base is at least partially overlapped with the orthographic projection of the first gate electrode on the substrate base. The interlayer dielectric layer includes a second via hole and a third via hole penetrating through the interlayer dielectric layer. An orthographic projection of the second via hole on the substrate base is at least partially overlapped with the orthographic projection of the active layer on the substrate base, and an orthographic projection of the third via hole on the substrate base covers the orthographic projection of the first via hole on the substrate base, the orthographic projection of the third via hole is at least partially overlapped with the orthographic projection of the second gate electrode. The connection electrode is electrically connected to the first gate electrode through the first via hole and the third via hole, and is electrically connected to the second gate electrode through the third via.

In some example arrangements of the present disclosure, the orthographic projection of the first gate electrode on the substrate base covers the orthographic projection of the active layer on the substrate base.

In some example arrangements of the present disclosure, the active layer includes a metal oxide semiconductor material.

In some example arrangements of the present disclosure, the connection electrode includes a transparent conductive material.

In some example arrangements of the present disclosure, the thin film transistor further includes: a passivation layer at a side of the source/drain electrode away from the substrate base; and a light shielding layer at a side of the passivation layer away from the substrate base, the light shielding layer being configured to absorb and/or reflect ambient light.

Another aspect of the present disclosure provides an array substrate including any one of the thin film transistors described above; and a photosensitive element at a side of the source/drain electrode of the thin film transistor away from the substrate base. The first electrode of the photosensitive element is connected with one of the source/drain electrode of the thin film transistor.

In some example arrangements of the present disclosure, the array substrate further includes a leading-out layer at a side of the photosensitive element away from the substrate base. The second electrode of the photosensitive element is connected with the leading-out layer.

In some example arrangements of the present disclosure, the array substrate further includes a conductive layer disposed at the same layer as the second gate electrode in the thin film transistor. The conductive layer is connected with the leading-out layer, and an orthographic projection of the conductive layer on the substrate base is at least partially overlapped with the orthographic projection of the source/drain electrode of the thin film transistor on the substrate base.

In some example arrangements of the present disclosure, the array substrate further includes a connection layer disposed at the same layer as the source/drain electrode of the thin film transistor. The conductive layer is connected with the leading-out layer through the connection layer.

A further aspect of the present disclosure provides a display device including any one of the array substrates described above.

Another aspect of the present disclosure further provides a fabricating method of a thin film transistor, including: providing a substrate base; forming a first gate electrode at a side of the substrate base; forming an active layer at a side of the first gate electrode away from the substrate base; forming a second gate electrode at a side of the active layer away from the substrate base; and forming a source/drain electrode at a side of the second gate electrode away from the substrate base. The orthographic projection of the source/drain electrode on the substrate base is at least partially overlapped with the orthographic projection of the second gate electrode on the substrate base.

In some example arrangements of the present disclosure, forming an active layer at a side of the first gate electrode away from the substrate base includes: forming a buffer layer at a side of the first gate electrode away from the substrate; and forming an active layer at a side of the buffer layer away from the substrate base. The buffer layer includes a first via hole penetrating through the buffer layer, and an orthographic projection of the first via hole on the substrate base is at least partially overlapped with the orthographic projection of the first gate electrode on the substrate base.

In some example arrangements of the present disclosure, forming a source/drain electrode at a side of the second gate electrode away from the substrate base includes: forming an interlayer dielectric layer at a side of the second gate electrode away from the substrate; and forming a source/drain electrode and a connection electrode at a side of the interlayer dielectric layer away from the substrate base. The interlayer dielectric layer includes a second via hole and a third via hole which penetrate through the interlayer dielectric layer, the orthographic projection of the second via hole on the substrate base is at least partially overlapped with the orthographic projection of the active layer on the substrate base, and the orthographic projection of the third via hole on the substrate base covers the orthographic projection of the first via hole on the substrate base. The connection electrode is electrically connected to the first gate electrode through the first via hole and the third via hole and is electrically connected to the second gate electrode through the third via hole. In some example arrangements of the present disclosure, the method further includes: forming a passivation layer at a side of the source/drain electrode away from the substrate base; and forming a light shielding layer at a side of the passivation layer away from the substrate base, the light shielding layer being configured to absorb and/or reflect ambient light.

It is not necessary for any product or method of implementing the present disclosure to achieve all of the advantages described above at the same time. Additional features and advantages of the present disclosure will be set forth in the following description, and will partially be obvious from the description, or may be learned by practice of the present disclosure. The objectives and other advantages of the arrangements of the present disclosure may be realized and obtained by the structure particularly pointed out in the description and claims hereof as well as the accompanying drawings.

BRIEF DESCRIPTION OF THE DRAWINGS

The accompanying drawings are intended to provide a further understanding of technical solutions of the present disclosure and constitute part of this specification, explain the technical solutions of the present disclosure together with arrangements of this application, without limiting the technical solutions of the present disclosure.

DETAILED DESCRIPTION

In order to make the objects, technical solutions and advantages of the present disclosure more apparent, the arrangements of the present disclosure will be described in detail below with reference to the accompanying drawings. It should be noted that the arrangements in this application and the features in the arrangements can be arbitrarily combined with each other without conflict.

The blocks illustrated in the flowcharts of the drawings may be performed in a computer system, such as a set of computer-executable instructions. Also, a logical sequence is shown in the flowcharts, however, in some cases, the blocks shown or described may be performed in a sequence different from that shown or described herein.

Unless defined otherwise, technical or scientific terms used in the present disclosure of the arrangements should be construed as having a meaning commonly understood by one of ordinary skill in the art to which this disclosure belongs to. The terms "first", "second" and the like in the arrangements of the present disclosure are merely used to distinguish one element from another, rather than denote any order, sequence, or importance. The presence of "first element" or the like in this disclosure does not imply the necessity of a second element, and the presence of "second element" or the like in this disclosure does not imply the necessity of a first element neither. The word "comprise", "include" or the like means that the element before this word encompasses the following listed elements, items and their equivalents, without excluding other elements or items. The term "connect", "couple" or the like is not limited to physical or mechanical connections, but may include direct or indirect electrical connections. "Up", "down", "left", or "right" is used only to indicate relative positional relationships, but may also change accordingly when the absolute position of the described object changes.

The currently used photosensitive element is a PIN diode, and the control device thereof is a Thin Film Transistor (TFT). However, the PIN diode generates more hydrogen atoms in the fabricating process, and these hydrogen atoms may erode a channel region of the active layer of the TFT, thus, the threshold voltage of the TFT is negatively drifted, the leakage current is increased, and the dark current is larger during optical detection, so that the signal-to-noise ratio cannot be ensured, and thus the optical compensation cannot be accurately performed.

Figure 1:
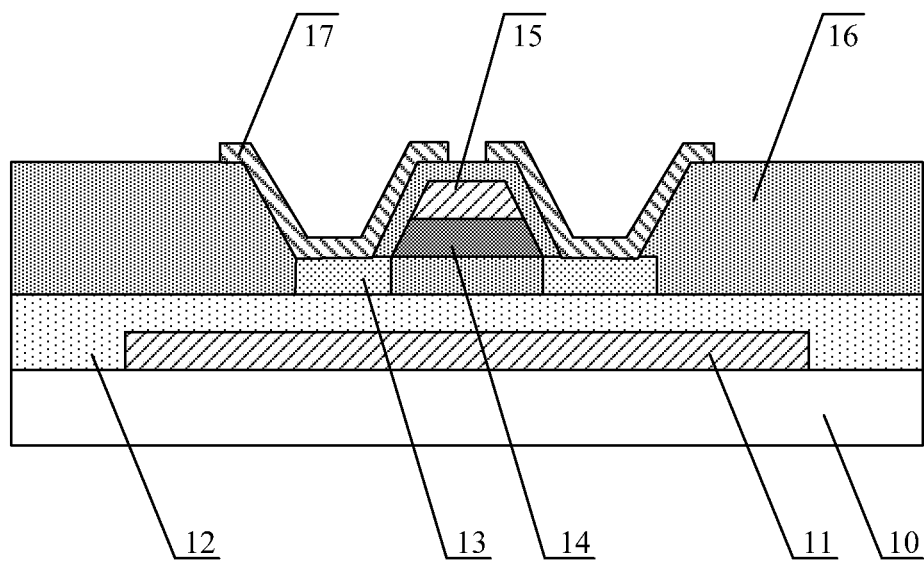
FIG. 1 is a schematic structural view of a thin film transistor according to an arrangement of the present disclosure.

FIG. 1 is a schematic structural view of a thin film transistor for controlling a PIN diode as a photosensitive element according to an arrangement of the present disclosure. As shown in FIG. 1, the thin film transistor provided by the arrangement of the present disclosure includes a first gate electrode 11, an active layer 13, a second gate electrode 15, and a source/drain electrode 17 disposed at a side of a substrate base 10.

Specifically, as shown in FIG. 1, the active layer 13 is disposed at a side of the first gate electrode 11 away from the substrate base 10, the second gate electrode 15 is disposed at a side of the active layer 13 away from the substrate base 10, the source/drain electrode 17 is disposed at a side of the second gate electrode 15 away from the substrate base 10, and an orthographic projection of the source/drain electrode 17 on the substrate base 10 is at least partially overlapped with an orthographic projection of the second gate electrode 15 on the substrate base 10.

In the above arrangements of the present disclosure, the active layer is disposed between the first gate electrode and the second gate electrode, and the orthographic projection of the source/drain electrode on the substrate and the orthographic projection of the second gate on the substrate are at least partially overlapped, so that it can be ensured that the active layer is completely shielded by the source/drain electrode and the second gate in the subsequent fabricating process, thus preventing hydrogen atoms from entering the active layer when the PIN diode is formed on the thin film transistor and thus corroding a channel region of the active layer of the thin film transistor. Therefore, negative drift of the threshold voltage of the thin film transistor can be avoided, leakage current of the thin film transistor is reduced, thus ensuring reduction of dark current and improved signal-to-noise ratio during optical detection, and thus ensuring the accurate optical compensation on the display.

It should be noted that, as shown in FIG. 1, the thin film transistor provided by the arrangement of the present disclosure further includes other layers, such as a buffer layer 12, a gate insulating layer 14, and an interlayer dielectric layer 16. The buffer layer 12 is disposed at a side of the first gate electrode 11 away from the substrate base 10, the gate insulating layer 14 is disposed at a side of the active layer 13 away from the substrate base 10, and the interlayer dielectric layer 16 is disposed at a side of the buffer layer 12 away from the substrate base 10.

The substrate base 10 may be a transparent insulating substrate, such as a glass substrate, a quartz substrate, or other suitable substrates, which is not limited in this disclosure.

The first gate electrode 11 is disposed on the substrate base 10, and the first gate electrode 11 may be made of a material include a copper-based metal, an aluminum-based metal, a nickel-based metal, or the like. For example, the copper-based metal includes copper, a copper-zinc alloy, a copper-nickel alloy, or a copper-zinc-nickel alloy, which is not limited in this disclosure.

In an example arrangement, the buffer layer 12 covers the entire substrate base 10, so that not only harmful impurities, ions, and the like in the substrate are prevented from diffusing into the active layer, but light such as ambient light can be absorbed and reflected, ensuring optical stability of the thin film transistor.

The buffer layer 12 may be made of a material including silicon oxide, silicon nitride, silicon oxynitride, or the like. For example, the buffer layer may have a single-layer structure composed of silicon nitride or silicon oxide, or a double-layer or multi-layer structure composed of silicon nitride and/or silicon oxide, which is not limited in this disclosure.

The active layer 13 is disposed on the buffer layer 12, and the active layer 13 may be made of a material including amorphous silicon, polysilicon, a metal oxide semiconductor, or the like.

Optionally, in order to reduce the leakage current of the thin film transistor, the active layer provided by the arrangement of the present disclosure may be made of a metal oxide semiconductor, such as indium gallium zinc oxide IGZO, indium zinc oxide IZO, zinc oxide, or gallium zinc oxide GZO.

The gate insulating layer 14 is disposed on the channel region of the active layer 13, and the gate insulating layer 14 may be made of a material including silicon oxide, silicon nitride, silicon oxynitride, or the like. For example, the gate insulating layer may have a single-layer structure composed of silicon nitride or silicon oxide, or a double-layer or multi-layer structure composed of silicon nitride and/or silicon oxide, which is not limited in this disclosure.

The second gate electrode 15 is disposed on the gate insulating layer 14, and the second gate electrode 15 may be made of one or more of alloys formed by one or more metals selected from molybdenum, copper, aluminum, titanium, or any combination thereof, or other suitable materials. For example, the second gate electrode may have a single-layer or multi-layer structure, which is not limited in this disclosure.

The interlayer dielectric layer 16 covers the substrate base 10, and the interlayer dielectric layer 16 may be made of a material including silicon oxide, silicon nitride, silicon oxynitride, or the like. For example, the interlayer dielectric layer 16 may also have a single-layer structure composed of silicon nitride or silicon oxide, or a double-layer or multi-layer structure composed of silicon nitride and/or silicon oxide, which is not limited in this disclosure.

The source/drain electrode 17 is disposed on the interlayer dielectric layer 16, and the source/drain electrode 17 may be made of one or more of alloys formed by one or more of molybdenum, copper, aluminum, and titanium, or any combination thereof, or other suitable materials. For example, the source/drain electrode may have a single-layer or multi-layer structure, which is not limited in this disclosure.

Figure 2:
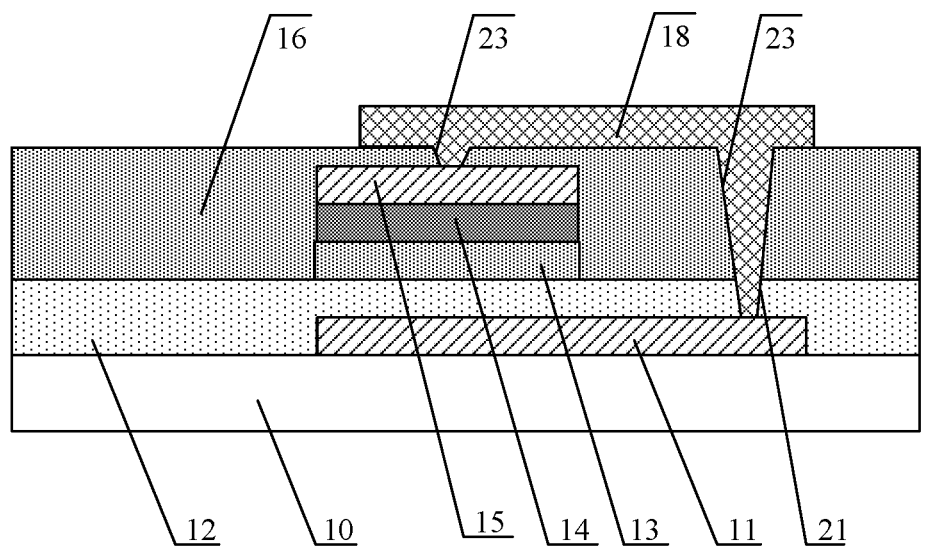
FIG. 2 is a schematic structural view of another thin film transistor according to an arrangement of the present disclosure.
Figure 3:
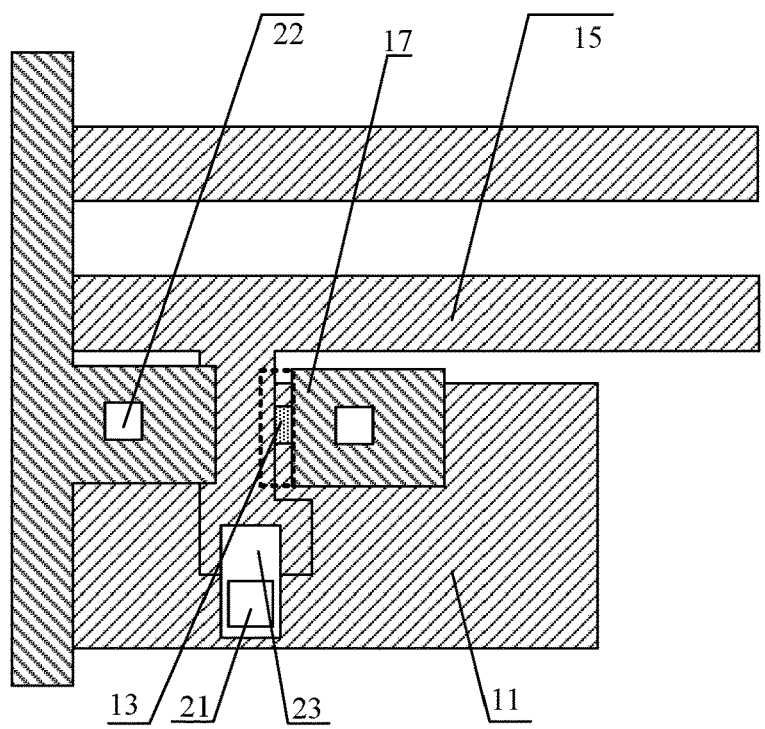
FIG. 3 is a plan view of a thin film transistor according to an arrangement of the present disclosure.

FIG. 2 is a schematic structural view of another thin film transistor according to an arrangement of the present disclosure, and FIG. 3 is a top view of the thin film transistor according to an arrangement of the present disclosure. It should be noted that a part of the source/drain electrode 17 is shown as a dotted line frame in this top view, in order to illustrate the active layer 13 located below the source/drain electrode layer. As shown in FIGS. 2 and 3, the thin film transistor further includes a connection electrode 18 disposed at a side of the interlayer dielectric layer 16 away from the substrate base 10, as compared to the arrangement shown in FIG. 1.

The connection electrode 18 may be made of a transparent conductive material, such as indium tin oxide or the like, and the arrangement of the present disclosure is not limited thereto. For example, in an example arrangement, the connection electrode 18 may be formed in the same patterning process as the source/drain electrode of the thin film transistor, i.e., the connection electrode is made of the same material as that of the source/drain electrode.

Further, the buffer layer 12 includes a first via hole 21 penetrating through the buffer layer 12, and an orthographic projection of the first via hole 21 on the substrate base 10 is at least partially overlapped with an orthographic projection of the first gate electrode 11 on the substrate base 10. The interlayer dielectric layer 16 includes a second via hole 22 and a third via hole 23 penetrating through the interlayer dielectric layer 16, an orthographic projection of the second via hole 22 on the substrate base 10 is at least partially overlapped with the orthographic projection of the active layer 13 on the substrate base 10, and an orthographic projection of the third via hole 23 on the substrate base 10 covers the orthographic projection of the first via hole 21 on the substrate base 10. The connection electrode 18 is electrically connected to the first gate electrode 11 through the first via hole 21 and the third via hole 23, and is electrically connected to the second gate electrode 15 through the third via hole 23. In other words, the first and third via holes 21 and 23 expose a portion of the first gate electrode 11, and the third via hole 23 exposes a portion of the second gate electrode 15.

As used herein, "penetrate" refers to passing through the entire thickness of the layer in a direction perpendicular to the substrate base.

Optionally, the interlayer dielectric layer 16 includes a fourth via hole exposing a first end of the active layer 13 in a direction parallel to the substrate base 10 and a fifth via hole exposing a second end of the active layer 13 in said direction. The source/drain electrode 17 is connected to the active layer 13 through the fourth via hole and the fifth via hole, respectively, and it should be noted that, referring to FIG. 3, the fourth via hole and the fifth via hole are both represented by the second via hole 22, and the source/drain electrode 17 is connected to the underlying active layer 13 through the second via hole 22.

Optionally, in an example arrangement, as shown in FIGS. 1 and 2, the first gate electrode 11 is disposed at a side of the substrate base 10, and the buffer layer 12, the active layer 13, the gate insulating layer 14, the second gate electrode 15, the interlayer dielectric layer 16, and the source/drain electrode are sequentially disposed at a side of the first gate electrode 11 away from the substrate base 10. Of course, the arrangements of the present disclosure are not limited thereto, and other structures may be used. It should be noted that although the source/drain electrodes are not shown in FIG. 2, the arrangement of the source/drain electrodes in the arrangement of FIG. 2 may be the same as that in FIG. 1, and FIGS. 1 and 2 are sectional views of the thin film transistor at different angles.

In the arrangement shown in FIG. 2, the first gate electrode 11 and the second gate electrode 15 are respectively located at both sides of the active layer 13 and are electrically connected by the connection electrode 18, so that the first gate electrode 11 and the second gate electrode 15 may simultaneously receive the same scanning signal transmitted from the gate line, thus ensuring a simultaneous driving effect on the active layer. Specifically, when the gate line is applied with a turn-on signal, an induced charge is generated on the surface of the active layer under the combined action of the first gate electrode and the second gate electrode, so that the thin film transistor is conducted, and the source electrode and the drain electrode are electrically connected to each other through a conductive channel in the active layer, thus enabling data transmission therebetween; when the gate line is applied with a turn-off signal, the source/drain electrode are disconnected from each other, and thus it is not possible to perform data transmission therebetween. Since the active layer in the thin film transistor is driven by the same voltage of the first gate electrode and the second gate electrode, the active layer can more stably conduct the source/drain electrode, thus improving the switching ratio of the thin film transistor, and ensuring the stability and the driving capability of the thin film transistor.

Figure 4:
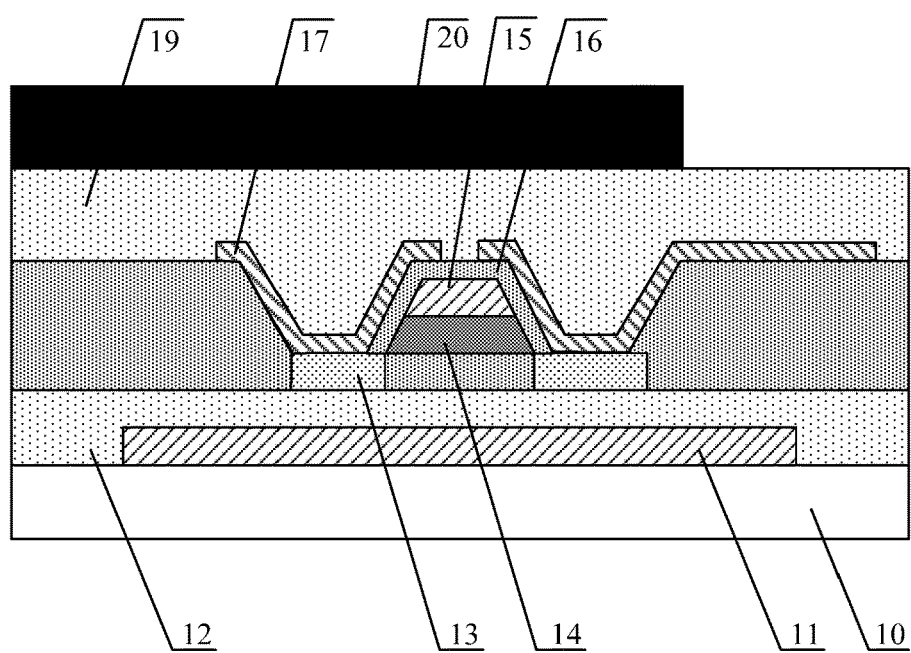
FIG. 4 is a schematic structural view of another thin film transistor according to an arrangement of the present disclosure.
Figure 5:
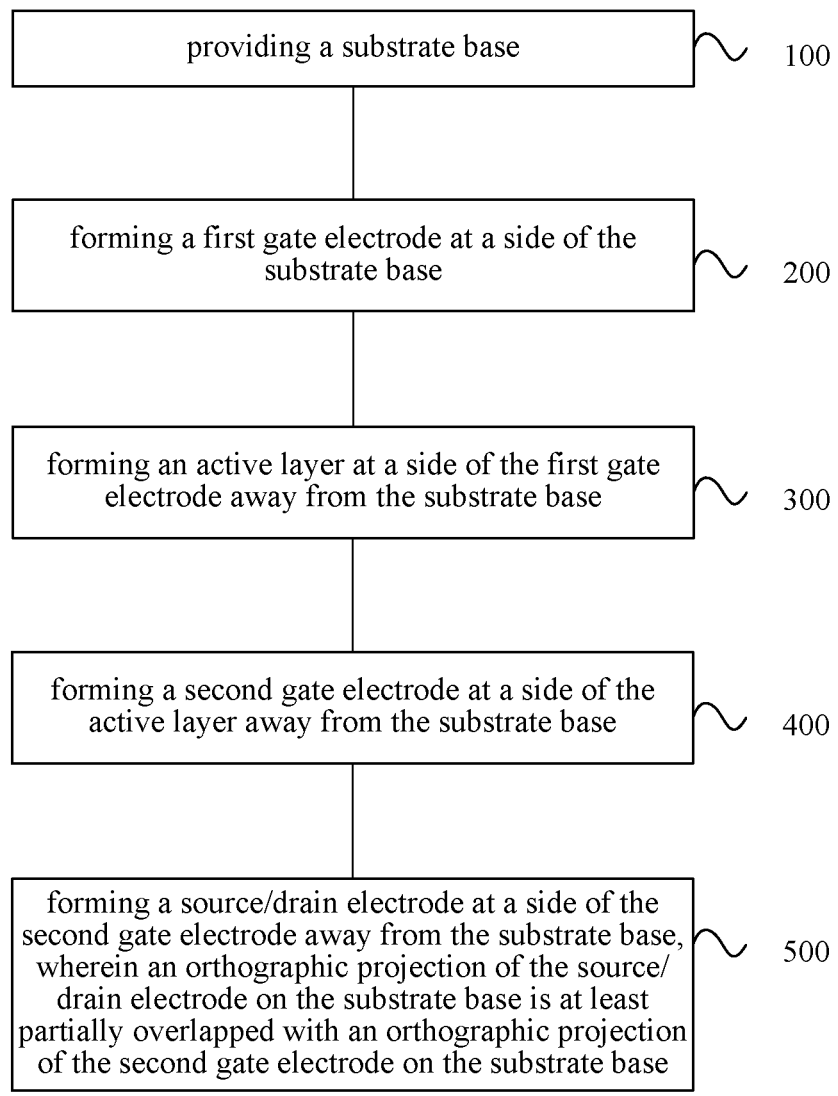
FIG. 5 is a flowchart of a fabricating method of a thin film transistor according to an arrangement of the present disclosure.

FIG. 4 is a schematic structural view of a thin film transistor according to another arrangement of the present disclosure. Compared with the arrangement shown in FIG. 1, the thin film transistor provided by this arrangement further includes a passivation layer 19 and a light shielding layer 20, as shown in FIG. 4.

Specifically, the passivation layer 19 is disposed at a side of the source/drain electrode 17 away from the substrate base 10, and the light shielding layer 20 is disposed at a side of the passivation layer 19 away from the substrate base 10 and configured to absorb and/or reflect ambient light.

The passivation layer 19 covers the entire substrate base 10, and the passivation layer 19 is made of a material including silicon oxide, silicon nitride, silicon oxynitride, or the like. For example, the passivation layer 19 may have a single-layer structure composed of silicon nitride or silicon oxide, or a double-layer or multi-layer structure composed of silicon nitride and/or silicon oxide, which is not limited in this disclosure.

Optionally, in order to sufficiently absorb and/or reflect the ambient light and prevent the light from entering the channel region of the active layer, the orthographic projection of the light shielding layer 20 on the substrate base 10 covers the orthographic projection of the entire active layer 13 on the substrate base 10.

In the arrangement of the present disclosure, the buffer layer 12 and the light shielding layer 20 are provided, ensuring that ambient light and OLED light are absorbed and/or reflected, so as to further reduce or eliminate the occurrence of a leakage current phenomenon in the channel region of the active layer, improve the product yield, and ensure the optical stability of the thin film transistor.

Optionally, as shown in FIGS. 1 and 4, in order to ensure that ambient light and OLED light are more sufficiently reflected, thus further reducing or eliminating the occurrence of the leakage current phenomenon in the channel region of the active layer, improving the product yield, and ensuring the optical stability of the thin film transistor, the orthographic projection of the first gate electrode 11 on the substrate base 10 may cover the orthographic projection of the active layer 13 on the substrate base 10.

The arrangement of the present disclosure further provides a fabricating method of a thin film transistor, and FIG.

5 is a flowchart of a fabricating method of a thin film transistor provided by the arrangement of the present disclosure.

In block 100, a substrate is provided. The substrate base may be a transparent insulating substrate, such as a glass substrate, a quartz substrate, or other suitable substrates, which is not limited in this disclosure.

In block 200, a first gate is formed at a side of a substrate base. The first gate electrode may be made of a material including copper-based metal, aluminum-based metal, nickel-based metal, or the like. For example, the copper-based metal includes copper, copper-zinc alloy, copper-nickel alloy, or copper-zinc-nickel alloy, which is not limited in this disclosure.

In block 300, an active layer is formed at a side of the first gate electrode away from the substrate base.

In an example arrangement, block 300 may specifically include: forming a buffer layer at a side of the first gate electrode away from the substrate base; forming a first via hole in the buffer layer. An orthographic projection of the first via hole on the substrate is at least partially overlapped with an orthographic projection of the first gate electrode on the substrate base; and forming an active layer at a side of the buffer layer away from the substrate base.

Optionally, the buffer layer may cover the entire substrate base, so that the buffer layer may not only prevent harmful impurities, ions, and the like in the substrate from diffusing into the active layer, but also absorb and reflect light such as ambient light, thus ensuring the optical stability of the thin film transistor.

The buffer layer may be made of a material including silicon oxide, silicon nitride, silicon oxynitride, or the like. For example, the buffer layer may have a single-layer structure composed of silicon nitride or silicon oxide, or a double-layer or multi-layer structure composed of silicon nitride and/or silicon oxide, which is not limited in this disclosure.

The active layer may be made of a material including amorphous silicon, polysilicon, or metal oxide semiconductor.

Further, in order to reduce the leakage current of the thin film transistor, the active layer provided by the arrangement of the present disclosure may be made of a metal oxide semiconductor, such as indium gallium zinc oxide IGZO, indium zinc oxide IZO, zinc oxide, or gallium zinc oxide GZO.

In block 400, a second gate electrode is formed at a side of the active layer away from the substrate base.

In an example arrangement, block 400 may specifically include: forming a gate insulating layer at a side of the active layer away from the substrate base; and forming a second gate electrode at a side of the gate insulating layer away from the substrate base.

The gate insulating layer may be made of a material including silicon oxide, silicon nitride, silicon oxynitride, or the like. For example, the gate insulating layer may have a single-layer structure composed of silicon nitride or silicon oxide, or a double-layer or multi-layer structure composed of silicon nitride and/or silicon oxide, which is not limited in this disclosure.

The second gate electrode may be made of one or more of alloys formed by one or more metals selected from molybdenum, copper, aluminum, titanium, or any combination thereof, or other suitable materials. For example, the second gate electrode may have a single-layer or multi-layer structure, which is not limited in this disclosure.

In block 500, a source/drain electrode is formed at a side of the second gate electrode away from the substrate base. The orthographic projection of the source/drain electrode on the substrate is at least partially overlapped with the orthographic projection of the second gate electrode on the substrate base.

According to the fabricating method of the thin film transistor, the active layer is disposed between the first gate electrode and the second gate electrode, and the orthographic projection of the source/drain electrode on the substrate base and the orthographic projection of the second gate electrode on the substrate base are at least partially overlapped, so that hydrogen atoms can be prevented from entering the active layer in the subsequent process to further corrode the channel region of the active layer of the thin film transistor, avoiding the negative drift of the threshold voltage of the thin film transistor, and reducing the leakage current in the thin film transistor.

In an example arrangement, block 500 may specifically include: forming an interlayer dielectric layer at a side of the second gate electrode away from the substrate base; forming a second via hole and a third via hole in the interlayer dielectric layer. The orthographic projection of the second via hole on the substrate base is at least partially overlapped with the orthographic projection of the active layer on the substrate base, and the orthographic projection of the third via hole on the substrate base covers the orthographic projection of the first via hole on the substrate base; and forming a source/drain electrode and a connection electrode at a side of the interlayer dielectric layer away from the substrate base. The connection electrode is electrically connected with the first gate electrode through the first via hole and the third via hole and is electrically connected with the second gate electrode through the third via hole.

Optionally, the interlayer dielectric layer covers the entire substrate base, and the interlayer dielectric layer may be made of a material including silicon oxide, silicon nitride, silicon oxynitride, or the like. For example, the interlayer dielectric layer may also have a single-layer structure composed of silicon nitride or silicon oxide, or a double-layer or multi-layer structure composed of silicon nitride and/or silicon oxide, which is not limited in this disclosure.

The connection electrode may be made of a transparent conductive material, such as indium tin oxide or the like, and this is not limited in this disclosure.

Optionally, the source/drain electrode may be made of one or more of alloys formed by one or more metals selected from molybdenum, copper, aluminum, titanium, or any combination thereof, or other suitable materials. For example, the source/drain electrode may have a single-layer or multi-layer structure, which is not limited in this disclosure.

In this arrangement, the first gate electrode and the second gate electrode are respectively positioned at two sides of the active layer, and are electrically connected through the connection electrode, so that the first gate electrode and the second gate electrode can simultaneously receive the same scanning signal transmitted from the gate line, thus ensuring a simultaneous driving effect on the active layer. Specifically, when the gate line is applied with a turn-on signal, an induced charge is generated on the surface of the active layer under the combined action of the first gate electrode and the second gate electrode, so that the thin film transistor is conducted, and the source electrode and the drain electrode are electrically connected to each other through a conductive channel in the active layer, thus enabling data transmission therebetween; when the gate line is applied with a turn-off signal, the source/drain electrode are disconnected from each other, and thus it is not possible to perform data transmission therebetween. Since the active layer in the thin film transistor is driven by the same voltage of the first gate electrode and the second gate electrode, the active layer can more stably conduct the source/drain electrode, thus improving the switching ratio of the thin film transistor, and ensuring the stability and the driving capability of the thin film transistor.

Optionally, after block 500, the fabricating method of the thin film transistor may further include: forming a passivation layer at a side of the source/drain electrode away from the substrate base; and forming a light shielding layer configured to absorb and/or reflect ambient light at a side of the passivation layer away from the substrate base.

Optionally, the passivation layer covers the entire substrate base, and the passivation layer may be made of a material including silicon oxide, silicon nitride, silicon oxynitride, or the like. For example, the passivation layer may have a single-layer structure composed of silicon nitride or silicon oxide, or a double-layer or multi-layer structure composed of silicon nitride and/or silicon oxide, which is not limited in this disclosure.

Optionally, in order to absorb and reflect the ambient light and prevent the light from entering the channel region of the active layer, in an example arrangement, the orthographic projection of the light shielding layer on the substrate base covers the orthographic projection of the active layer on the substrate base.

In the above arrangement, the buffer layer and the light shielding layer are simultaneously disposed, so that ambient light and OLED light can be absorbed and reflected, thus further reducing or eliminating the occurrence of leakage current in the channel region of the active layer, improving the product yield, and ensuring the optical stability of the thin film transistor.

A fabricating method of a thin film transistor provided by an arrangement of the present disclosure is further described below with reference to FIGS. 6A-6G. The patterning process may be, for example, a photolithography patterning process, and the flow thereof mainly includes: coating photoresist on the structural layer to be patterned, exposing the photoresist by using a mask plate, developing the exposed photoresist to obtain a photoresist pattern, etching the structural layer by using the photoresist pattern as the mask plate, and stripping the photoresist.

Figure 6A:
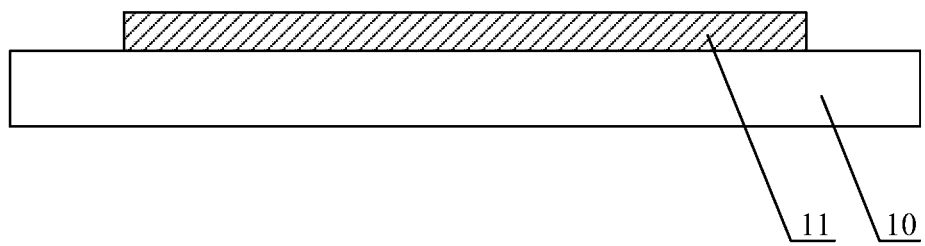
FIG. 6A is a schematic view of a fabricating method of a thin film transistor according to an arrangement of the present disclosure.

In a fabricating method of a thin film transistor according to an arrangement of the present disclosure, firstly, as shown in FIG. 6A, a substrate base 10 is provided, and a first metal film is formed on the substrate base 10, and a patterning process is performed on the first metal film to form a first gate electrode 11.

In specific implementation, the first metal film may be deposited on the substrate base 10 by a physical vapor deposition process or the like. The substrate base 10 may be a transparent insulating substrate, such as a glass substrate, a quartz substrate, or other suitable substrates, which is not limited in this disclosure. The first metal thin film may include copper-based metal, aluminum-based metal, nickel-based metal, or the like. For example, the copper-based metal includes copper, copper-zinc alloy, copper-nickel alloy, or copper-zinc-nickel alloy, which is a copper-based metal alloy having stable properties.

Figure 6B:
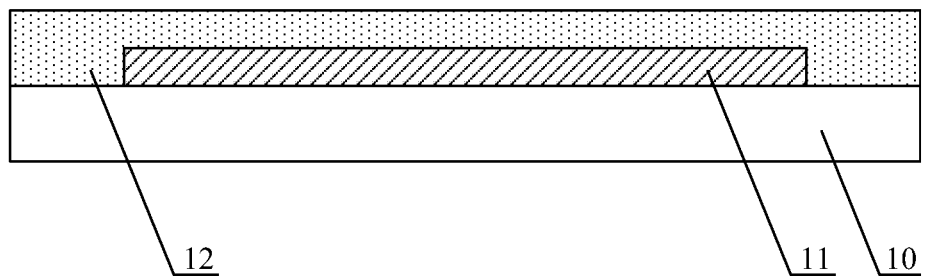
FIG. 6B is a schematic view of a fabricating method of a thin film transistor according to an arrangement of the present disclosure.

Next, a buffer layer 12 is formed on the first gate electrode 11, as shown in FIG. 6B. In an arrangement, the buffer layer 12 may be deposited on the first gate electrode 11 by using a Chemical Vapor Deposition (CVD) process.

The buffer layer may be made of a material including silicon oxide, silicon nitride, silicon oxynitride, or the like. For example, the buffer layer may have a single-layer structure composed of silicon nitride or silicon oxide, or a double-layer or multi-layer structure composed of silicon nitride and/or silicon oxide, which is not limited in this disclosure.

Figure 6C:
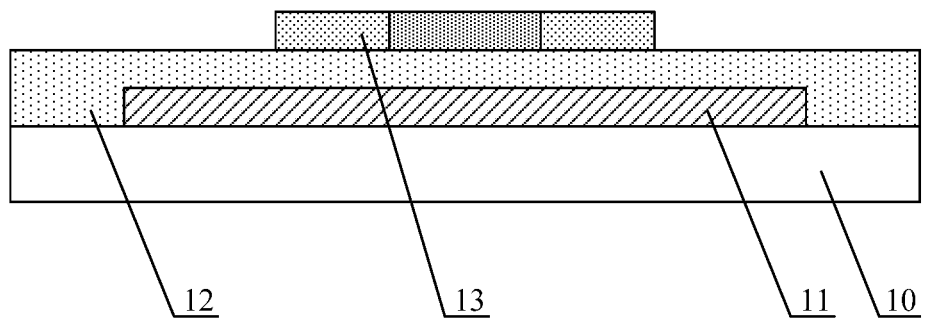
FIG. 6C is a schematic view of a fabricating method of a thin film transistor according to an arrangement of the present disclosure.

Then, the active layer 13 is formed on the buffer layer 12, as shown in FIG. 6C. In the specific implementation, the active layer may be made of amorphous silicon, polysilicon, or metal oxide semiconductor.

Further, in order to reduce the leakage current of the thin film transistor, the active layer may be made of a metal oxide semiconductor, such as indium gallium zinc oxide IGZO, indium zinc oxide IZO, zinc oxide, or gallium zinc oxide GZO.

Figure 6D:
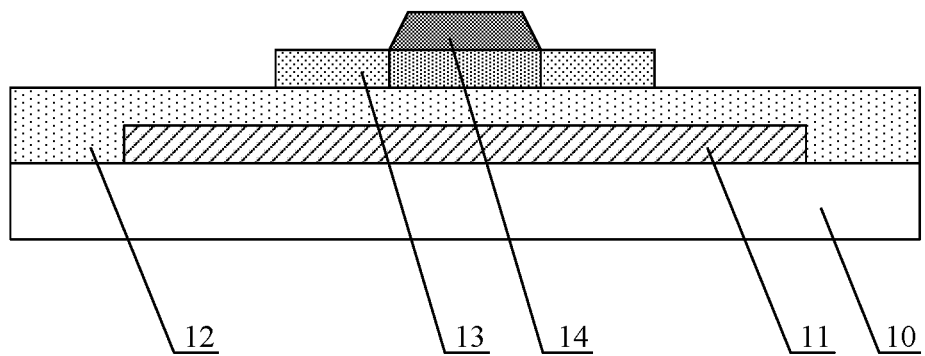
FIG. 6D is a schematic view of a fabricating method of a thin film transistor according to an arrangement of the present disclosure.

Next, a gate insulating layer 14 is formed on the active layer 13, as shown in FIG. 6D. In specific implementation, the gate insulating layer 14 may be deposited on the channel region of the active layer by a CVD process or the like.

The gate insulating layer may be a silicon oxide layer, a silicon nitride layer, or a composite insulating layer composed of silicon oxide and silicon nitride, which is not limited in this disclosure.

The gate insulating layer may be made of a material including silicon oxide, silicon nitride, silicon oxynitride, or the like. For example, the gate insulating layer may have a single-layer structure composed of silicon nitride or silicon oxide, or a double-layer or multi-layer structure composed of silicon nitride and/or silicon oxide, which is not limited in this disclosure.

Figure 6E:
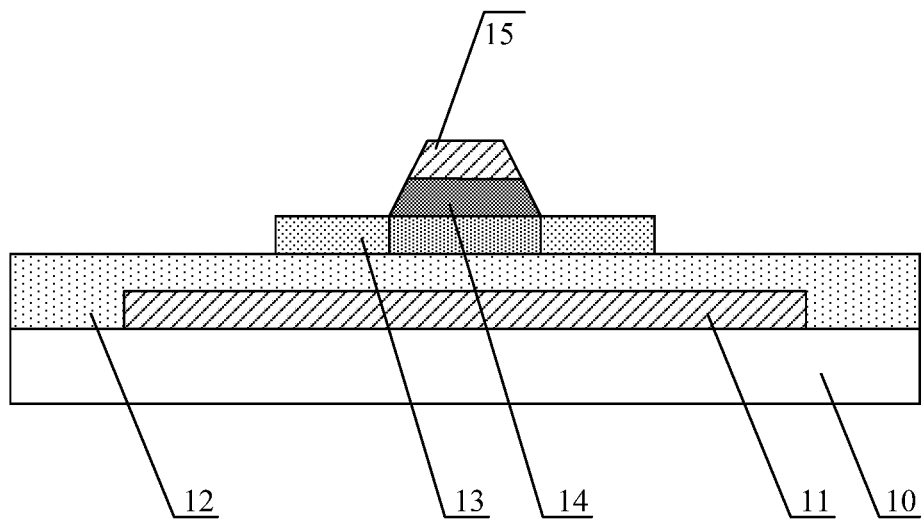
FIG. 6E is a schematic view of a fabricating method of a thin film transistor according to an arrangement of the present disclosure.

Then, a second metal film is deposited on the gate insulating layer 14, and a patterning process is performed on the second metal film to form a second gate electrode 15, as shown in FIG. 6E. In specific implementation, the second metal film may be deposited on the gate insulating layer 14 by physical vapor deposition or the like.

The second metal film may be made of one or more of alloys formed by one or more metals selected from molybdenum, copper, aluminum, titanium, or any combination thereof, or other suitable materials. For example, the second gate electrode may have a single-layer or multi-layer structure, which is not limited in this disclosure.

Figure 6F:
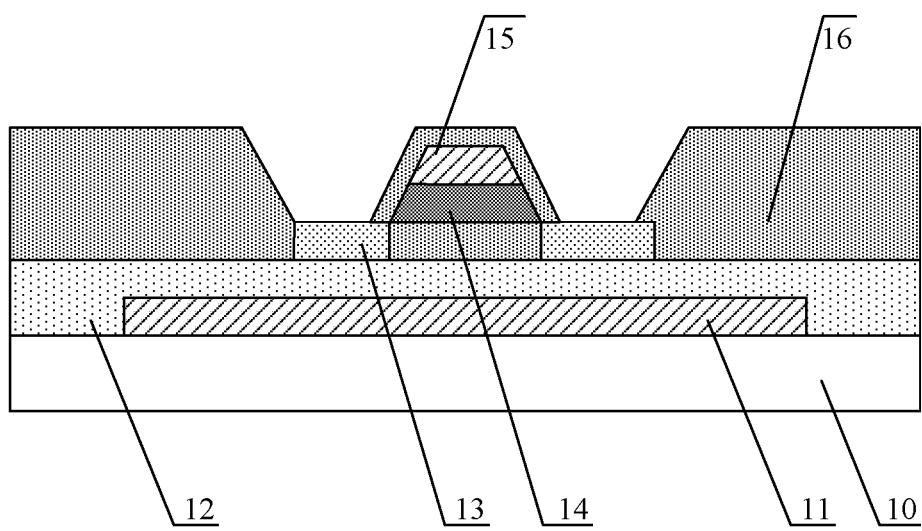
FIG. 6F is a schematic view of a fabricating method of a thin film transistor according to an arrangement of the present disclosure.

Then, an insulating film is deposited on the second gate electrode 15, and a patterning process is performed on the insulating film to form an interlayer dielectric layer 16, as shown in FIG. 6F. In specific implementation, an insulating film may be deposited on the second gate electrode by using a CVD process or the like, and a fourth via hole exposing one end of the active layer in a direction parallel to the substrate base, a fifth via hole exposing the other end of the active layer in the direction, a second via hole exposing the second gate electrode, a first via hole exposing the first gate electrode, and a third via hole exposing the first via hole are formed through a patterning process.

The insulating film may include silicon oxide, silicon nitride, silicon oxynitride, or the like. For example, the interlayer dielectric layer may also have a single-layer structure composed of silicon nitride or silicon oxide, or a double-layer or multi-layer structure composed of silicon nitride and/or silicon oxide, which is not limited in this disclosure.

Figure 6G:
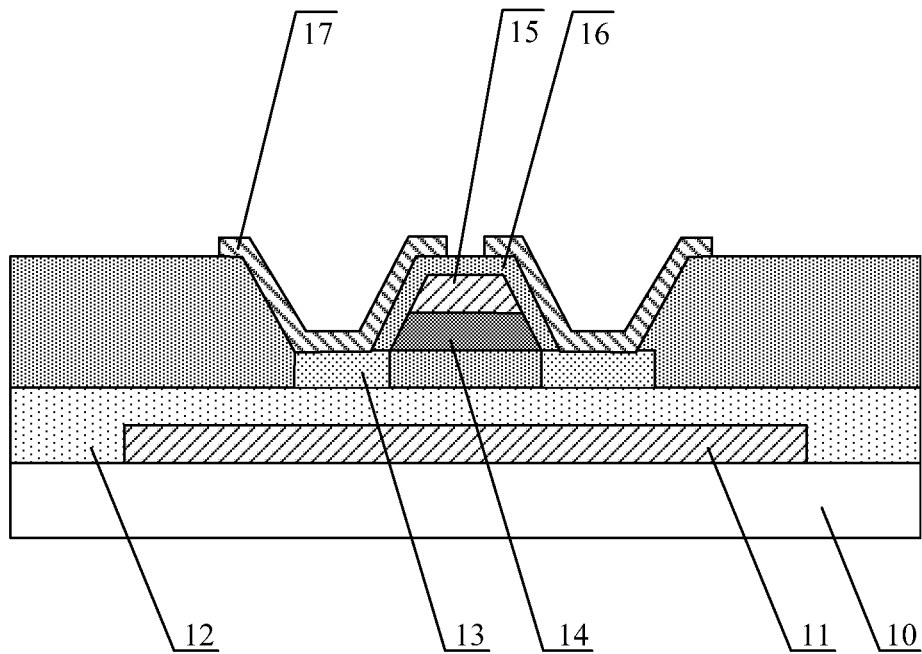
FIG. 6G is a schematic view of a fabricating method of a thin film transistor according to an arrangement of the present disclosure.

Next, as shown in FIG. 6G, a source/drain electrode 17 and a connection electrode (not shown) are formed on the interlayer dielectric layer 16. In a specific implementation, forming the source/drain electrode 17 may include physically depositing a third metal film on the interlayer dielectric layer 16, and performing a patterning process on the third metal film to form the source/drain electrode 17.

The third metal film may be made of one or more of alloys formed by one or more metals selected from molybdenum, copper, aluminum, titanium, or any combination thereof, or other suitable materials. For example, the second gate electrode may have a single-layer or multi-layer structure, which is not limited in this disclosure.

Then, a passivation layer 19 and a light shielding layer 20 are formed on the source/drain electrodes 17 to form a thin film transistor as shown in FIG. 4. In a specific implementation, an insulating film may be deposited on the source/drain electrode 17 by using a CVD process to act as a passivation layer, and a light shielding layer 20 may be formed on the passivation layer to act as a black matrix layer.

The insulating film may include silicon oxide, silicon nitride, silicon oxynitride, or the like. For example, the interlayer dielectric layer may also have a single-layer structure composed of silicon nitride or silicon oxide, or a double-layer or multi-layer structure composed of silicon nitride and/or silicon oxide, which is not limited in this disclosure.

It should be noted that if the thin film transistor manufactured by the above method is applied to an array substrate, the fabricating method of the array substrate includes the above blocks. Further, in the fabricating method of an array substrate, a conductive layer may be formed in the block of forming the second gate electrode, and a connection layer may be formed in the block of forming the source/drain electrode and the connection electrode. Thereafter, the method may further include: providing a PIN diode on the source electrode or the drain electrode; forming a passivation layer on the PIN diode. The passivation layer covers the entire substrate base and includes a via hole exposing the PIN diode; depositing a transparent conductive material on the passivation layer, and forming a leading-out layer through a patterning process; and forming a light shielding layer on the leading-out layer.

Figure 7:
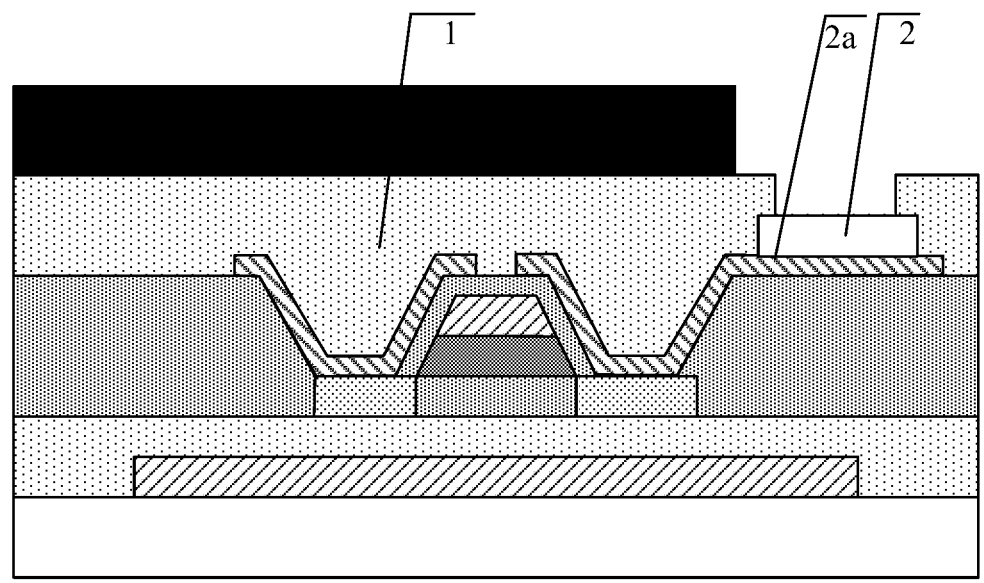
FIG. 7 is a schematic structural view of an array substrate according to an arrangement of the present disclosure.

Based on the inventive concept of the above arrangement, the arrangement of the present disclosure further provides an array substrate. FIG. 7 is a schematic structural view of an array substrate according to an arrangement of the present disclosure. As shown in FIG. 7, the array substrate provided by the arrangement of the present disclosure includes a thin film transistor 1 and a photosensitive element 2. The thin film transistor 1 is the thin film transistor provided in any one of the above arrangements. The photosensitive element 2 is disposed at a side of the source/drain electrode of the thin film transistor 1 away from the substrate base, and the first electrode 2a of the photosensitive element 2 is connected to the source electrode or the drain electrode of the thin film transistor 1.

In an example arrangement, the photosensitive element 2 may be a PIN diode.

In an example arrangement, as shown in FIG. 7, the orthographic projection of the source electrode or the drain electrode of the thin film transistor on the substrate base in the arrangement of the present disclosure covers the orthographic projection of the photosensitive element on the substrate base.

In the array substrate provided by the arrangement of the present disclosure, the active layer is disposed between the first gate electrode and the second gate electrode, and the orthographic projection of the source/drain electrode on the substrate base is at least partially overlapped with the orthographic projection of the second gate electrode on the substrate base, so that hydrogen atoms can be prevented from entering the active layer when the photosensitive element is manufactured to corrode the channel region of the active layer of the thin film transistor, thus avoiding the negative drift of the threshold voltage of the thin film transistor, reducing the leakage current in the thin film transistor, further ensuring the reduction of dark current and the acceptable signal-to-noise ratio during optical detection, and thus performing the optical compensation on a display.

Figure 8:
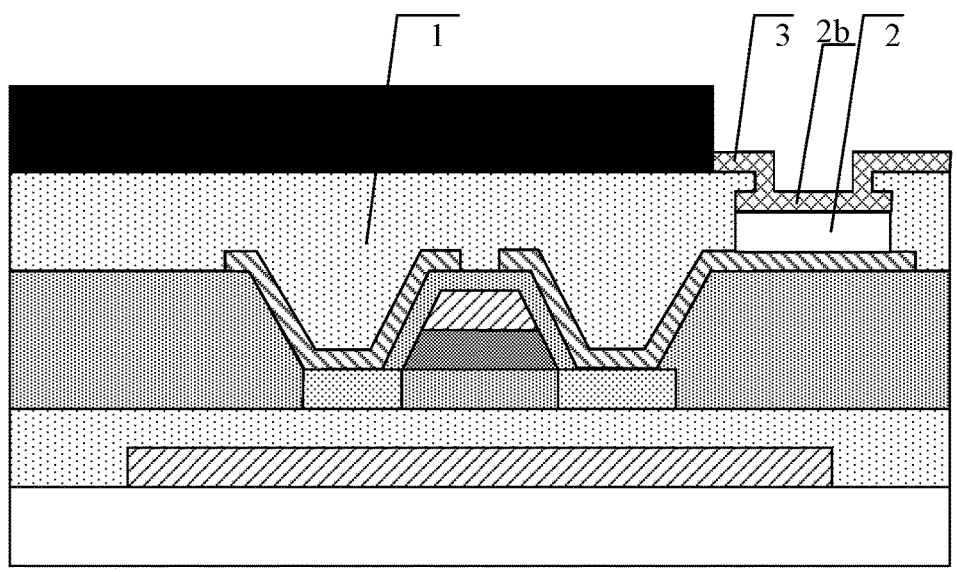
FIG. 8 is a schematic structural view of another array substrate according to an arrangement of the present disclosure.

FIG. 8 is a schematic structural view of an array substrate according to another arrangement of the present disclosure. As shown in FIG. 8, compared with the array substrate shown in FIG. 7, the array substrate provided by the arrangement of the present disclosure further includes a leading-out layer 3. The leading-out layer 3 is disposed at a side of the photosensitive element 2 away from the substrate base 10, and the second electrode 2b of the photosensitive element 2 is connected to the leading-out layer 3. In this arrangement, the leading-out layer 3 functions as a wire.

The conductive layer 3 may be made of a transparent conductive material, such as indium tin oxide, and this arrangement of the present disclosure is not limited herein.

It should be noted that, as shown in FIG. 8, in the process of fabricating the array substrate, after the fabricating of the source/drain electrode of the thin film transistor is completed, the PIN diode is disposed at a side of the source electrode or the drain electrode away from the substrate base, and then a passivation layer including a via hole is formed at a side of the source/drain electrode and the PIN diode away from the substrate base. The leading-out layer 3 is connected to the PIN diode through a via hole in the passivation layer.

Since the array substrate provided by the arrangement of the present disclosure includes the thin film transistor provided by any one of the arrangements, the implementation principle and the implementation effect are similar, which will not be repeated herein.

In the array substrate provided in the arrangement of the present disclosure, when the first gate electrode and the second gate electrode simultaneously receive a conducting signal, the thin film transistor 1 is conducted to drive the photosensitive element 2 to emit light.

Figure 9:
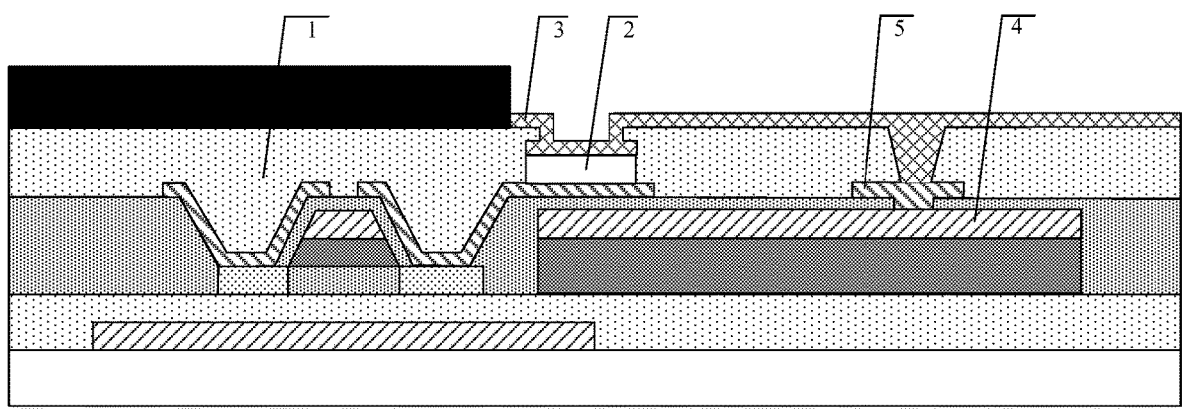
FIG. 9 is a schematic structural view of another array substrate according to an arrangement of the present disclosure.

FIG. 9 is a schematic structural view of an array substrate according to another arrangement of the present disclosure. As shown in FIG. 9, compared with the array substrate shown in FIG. 8, the array substrate provided by the arrangement of the present disclosure further includes a conductive layer 4.

The conductive layer 4 is disposed on the same layer as the second gate electrode of the thin film transistor 1, and is connected to the leading-out layer 3. In particular, an orthographic projection of the conductive layer 4 on the substrate base is at least partially overlapped with an orthographic projection of the source/drain electrode in the thin film transistor on the substrate.

In the above arrangement, the conductive layer 4 and the source/drain electrode form a capacitance to store or discharge electric quantity. The leading-out layer 3 is connected to the conductive layer 4 for supplying an electrical signal to the conductive layer 4.

The conductive layer 4 may be made of the same material as or different from the material of the second gate electrode. When the conductive layer 4 is made of the same material as that of the second gate electrode, the conductive layer 4 and the second gate electrode may be formed simultaneously in the same process, thus simplifying the fabricating process.

The conductive layer 4 and the leading-out layer 3 may be connected by via holes. Optionally, as shown in FIG. 9, the array substrate further includes a connection layer 5. The connection layer 5 is arranged in the same layer as the source/drain electrode in the thin film transistor, so that the conductive layer 4 is connected to the leading-out layer 3 through the connection layer 5.

In this arrangement, the connection layer 5 is provided to prevent connection of the leading-out layer 3 and the conductive layer 4 from being broken due to poor electrical connection of the via hole when the leading-out layer 3 is connected to the conductive layer 4 through the via hole.

The connection layer 5 may be made of a material with low electrical conductivity and low resistivity, which is not limited in this disclosure.

The material of the connection layer 5 may be the same as or different from the material of the source/drain electrode. When the material of the connection layer 5 is the same as the material of the source/drain electrode, the connection layer 5 and the source/drain electrode may be formed simultaneously in the same process, thus simplifying the fabricating process.

Based on the inventive concept of the above arrangements, an arrangement of the present disclosure further provides a display device including any one of the above array substrates.

Since the display device includes the array substrate provided in any one of the above arrangements, the implementation principle and the implementation effect thereof are similar, which will not be repeated herein.

The display device may be any product or component with display function, such as a television, a digital camera, a mobile phone, a watch, a notebook computer, a navigator and the like.

The drawings of the arrangements of the present disclosure only relate to the structures related to the arrangements of the present disclosure, and other structures can be referred to the general design.

In the drawings used to describe arrangements of the present disclosure, thicknesses and dimensions of the layers or microstructures are exaggerated for clarity. It should be understood that, when an element such as a layer, a film, a region or a substrate is referred to as being "on" or "under" another element, it can be "directly on" or "directly under" another element, or intervening elements may be present.

Arrangements of the present disclosure, i.e., features of arrangements, may be combined with each other to obtain new arrangements without conflict.

Although implementations disclosed in the present disclosure are described above, the disclosed contents are only adopted to facilitate understanding of the present disclosure, and are not intended to limit the present disclosure. Any person skilled in the art to which this disclosure belongs may make any changes or modifications in form and detail without departing from the spirit and scope of the present disclosure, and the scope of the present disclosure needs to be determined by that of the appended claims.

What is claimed is:

1. A thin film transistor, comprising:
a substrate base;
a first gate electrode at a side of the substrate base;
an active layer at a side of the first gate electrode away from the substrate base;
a second gate electrode at a side of the active layer away from the substrate base;
a source/drain electrode at a side of the second gate electrode away from the substrate base, wherein an orthographic projection of the source/drain electrode on the substrate base is at least partially overlapped with an orthographic projection of the second gate electrode on the substrate base;
a buffer layer at a side of the first gate electrode away from the substrate base;
a gate insulating layer at a side of the active layer away from the substrate base; and
an interlayer dielectric layer at a side of the second gate electrode away from the substrate base, and a connection electrode at a side of the interlayer dielectric layer away from the substrate base, wherein:
the buffer layer comprises a first via hole penetrating through the buffer layer, and an orthographic projection of the first via hole on the substrate base is at least partially overlapped with an orthographic projection of the first gate electrode on the substrate base;
the interlayer dielectric layer comprises a second via hole and a third via hole penetrating through the interlayer dielectric layer, an orthographic projection of the second via hole on the substrate base is at least partially overlapped with the orthographic projection of the active layer on the substrate base, an orthographic projection of the third via hole on the substrate base covers the orthographic projection of the first via hole on the substrate base, and the orthographic projection of the third via hole is at least partially overlapped with the orthographic projection of the second gate electrode; and
the connection electrode is electrically connected to the first gate electrode through the first via hole and the third via hole, and is electrically connected to the second gate electrode through the third via.

2. The thin film transistor according to claim 1, wherein an orthographic projection of the first gate electrode on the substrate covers an orthographic projection of the active layer on the substrate base.

3. The thin film transistor according to claim 1, wherein the active layer comprises a metal oxide semiconductor material.

4. The thin film transistor according to claim 1, wherein the connection electrode comprises a transparent conductive material.

5. The thin film transistor according to claim 1, further comprising:
a passivation layer at a side of the source/drain electrode away from the substrate base; and
a light shielding layer at a side of the passivation layer away from the substrate base, the light shielding layer being configured to absorb and/or reflect ambient light.

6. An array substrate comprising:
a thin film transistor, comprising:
a substrate base, a first gate electrode at a side of the substrate base, an active layer at a side of the first gate electrode away from the substrate base, a second gate electrode at a side of the active layer away from the substrate base, a source/drain electrode at a side of the second gate electrode away from the substrate base, wherein an orthographic projection of the source/drain electrode on the substrate base is at least partially overlapped with an orthographic projection of the second gate electrode on the substrate base, a buffer layer at a side of the first gate electrode away from the substrate base, a gate insulating layer at a side of the active layer away from the substrate base, and an interlayer dielectric layer at a side of the second gate electrode away from the substrate base, and a connection electrode at a side of the interlayer dielectric layer away from the substrate base;

wherein the buffer layer comprises a first via hole penetrating through the buffer layer, and an orthographic projection of the first via hole on the substrate base is at least partially overlapped with an orthographic projection of the first gate electrode on the substrate base;

wherein the interlayer dielectric layer comprises a second via hole and a third via hole penetrating through the interlayer dielectric layer, an orthographic projection of the second via hole on the substrate base is at least partially overlapped with the orthographic projection of the active layer on the substrate base, an orthographic projection of the third via hole on the substrate base covers the orthographic projection of the first via hole on the substrate base, and the orthographic projection of the third via hole is at least partially overlapped with the orthographic projection of the second gate electrode; and wherein the connection electrode is electrically connected to the first gate electrode through the first via hole and the third via hole, and is electrically connected to the second gate electrode through the third via; and a photosensitive element at a side of the source/drain electrode of the thin film transistor away from the substrate base, wherein a first electrode of the photosensitive element is connected with one of the source/drain electrode of the thin film transistor.

7. The array substrate according to claim 6, further comprising a leading-out layer at a side of the photosensitive element away from the substrate base, wherein a second electrode of the photosensitive element is connected to the leading-out layer.

8. The array substrate according to claim 7, further comprising a conductive layer in the same layer as the second gate electrode in the thin film transistor, wherein the conductive layer is connected to the leading-out layer, and an orthographic projection of the conductive layer on the substrate base is at least partially overlapped with an orthographic projection of the source/drain electrode of the thin film transistor on the substrate base.

9. The array substrate according to claim 8, further comprising a connection layer in the same layer as the source/drain electrode of the thin film transistor, wherein the conductive layer is connected to the leading-out layer through the connection layer.

10. The array substrate according to claim 6, wherein the array substrate is implemented in a display device.

11. A fabricating method of a thin film transistor comprising:

providing a substrate base;

forming a first gate electrode at a side of the substrate base;

forming an active layer at a side of the first gate electrode away from the substrate base;

forming a second gate electrode at a side of the active layer away from the substrate base; and forming a source/drain electrode at a side of the second gate electrode away from the substrate base, wherein an orthographic projection of the source/drain electrode on the substrate base is at least partially overlapped with an orthographic projection of the second gate electrode on the substrate base, and forming the active layer at the side of the first gate electrode away from the substrate base comprises:

forming a buffer layer at a side of the first gate electrode away from the substrate base, in which the buffer layer comprises a first via hole penetrating through the buffer layer, and an orthographic projection of the first via hole on the substrate base is at least partially overlapped with the orthographic projection of the first gate electrode on the substrate base; and forming an active layer at a side of the buffer layer away from the substrate base.

12. The method according to claim 11, further comprising:

forming a passivation layer at a side of the source/drain electrode away from the substrate base; and forming a light shielding layer at a side of the passivation layer away from the substrate base, the light shielding layer being configured to absorb and/or reflect ambient light.

13. The method according to claim 11, wherein forming the source/drain electrode at the side of the second gate electrode away from the substrate base comprises:

forming an interlayer dielectric layer at a side of the second gate electrode away from the substrate base, in which the interlayer dielectric layer comprises a second via hole and a third via hole which penetrate through the interlayer dielectric layer, an orthographic projection of the second via hole on the substrate base is at least partially overlapped with an orthographic projection of the active layer on the substrate base, and an orthographic projection of the third via hole on the substrate base covers the orthographic projection of the first via hole on the substrate base; and forming a source/drain electrode and a connection electrode at a side of the interlayer dielectric layer away from the substrate base, in which the connection electrode is electrically connected to the first gate electrode through the first via hole and the third via hole and is electrically connected to the second gate electrode through the third via hole.

\* \* \* \* \*